HEATING AND CONDUCTIVE-LEAD-CUTTING MEANS FOR SEMICONDUCTOR DEVICES

Filed June 29, 1960

3 Sheets-Sheet 1

INVENTOR
S. S. CHARSCHAN
BY
Albert R. Hodges
ATTORNEY

INVENTOR
S. S. CHARSCHAN
BY
Albert R. Hodges
ATTORNEY

Aug. 7, 1962 S. S. CHARSCHAN 3,048,689

HEATING AND CONDUCTIVE-LEAD-CUTTING MEANS
FOR SEMICONDUCTOR DEVICES

Filed June 29, 1960 3 Sheets-Sheet 3

INVENTOR
S. S. CHARSCHAN
BY Albert R. Hodges
ATTORNEY 3,048,689

HEATING AND CONDUCTIVE-LEAD-CUTTING MEANS FOR SEMICONDUCTOR DEVICES

Sidney S. Charschan, Levittown, Pa., assignor to Western Electric Company, Incorporated, New York, N.Y., a corporation of New York Filed June 29, 1960, Ser. No. 39,670
13 Claims. (Cl. 219—68)

This invention relates to heating and conductive-lead-cutting means for semiconductor devices, and more particularly to such means which are adapted for utilization during the operation of securing semiconductive wafers and conductive leads to semiconductor devices.

The manufacture of a semiconductor device includes the steps of securing a semiconductive wafer to the body portion or header of the device and of connecting by means of conductive lead preselected regions of the wafer to the device terminals. Normally, either of these bonding steps requires the application of heat to the members being joined.

In the past, the heating of semiconductor devices has been effected by conventional fixtures, such as ovens, coils, hot bodies, and the like. These fixtures are subject to a number of disadvantages, among which may be included relatively long operating periods, inefficient operation in that the heating is not localized, and relative lack of temperature control with respect to the parts being bonded.

An object of the invention is to provide new and improved means for heating semiconductor devices.

A further object of the invention is to provide new and improved means for heating semiconductor devices whereby the heating is rapid, localized, and accurately controllable.

In another aspect of the present invention, the heating means provided may also be employed for cutting to the prescribed lengths the conductive lead utilized to connect the selected regions of the wafer to the terminals of the semiconductor device. This aspect is particularly advantageous in that it facilitates the automation of the bonding operation by making more feasible the utilization of a source of continuous conductive lead. By way of example, a bonding operation wherein the means of the present invention would be of advantage is described in a copending patent application of S. S. Charschan, Serial No. 15,737, filed March 17, 1960, and assigned to the assignee of the present application.

An apparatus illustrating certain aspects of the invention might comprise an electrode adapted to be fitted on the header of the semiconductor device, means including the electrode for selectively passing heating current through the header, means for positioning conductive lead across the electrode with at least one outer portion of the lead extending beyond an extremity of the electrode, and means including the electrode for selectively passing cutting current having a value greater than the current-carrying capacity of the lead through only the outer portion of the lead.

A complete understanding of the invention may be obtained from the following detailed description of means forming specific embodiments thereof when read in conjunction with the appended drawings, in which.

Figure 2:
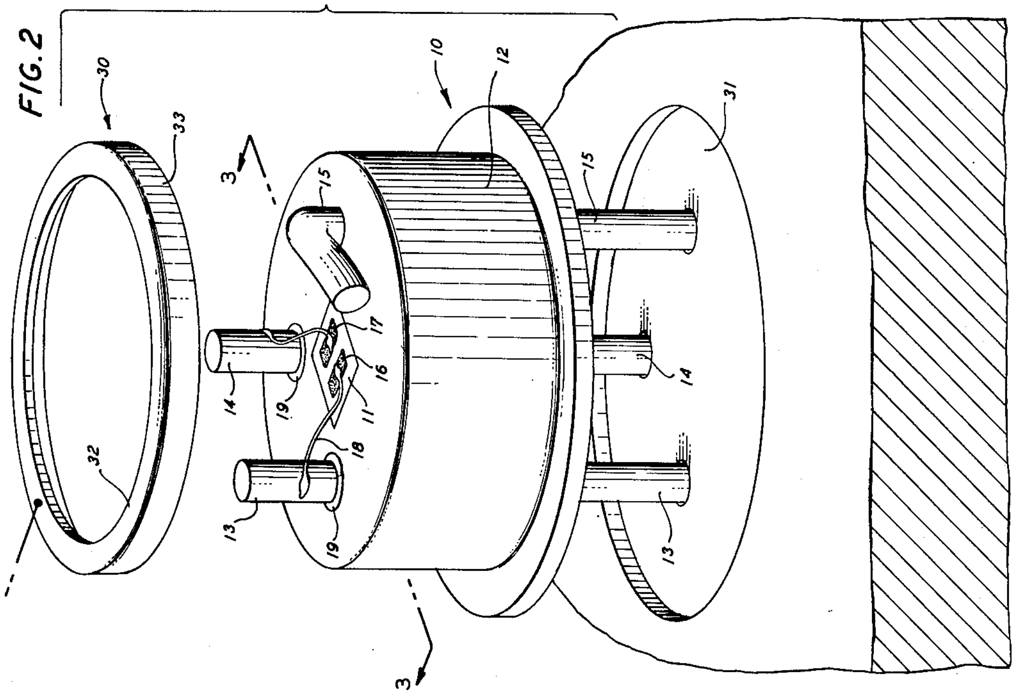
FIG. 2 is an exploded perspective view showing the electrode members utilized in the system of FIG. 1.

The embodiment selected for description is adapted to be utilized with a transistor device. As is best seen in FIG. 2, a transistor 10 normally comprises a semiconductive wafer 11 which is mounted upon a body portion or header 12. The semiconductive wafer 11 is divided into three regions known as the base, emitter and collector. These regions are individually connected to circuitry external to the transistor by means of a base terminal 13, an emitter terminal 14 and a collector terminal 15. Each region of the wafer 11, therefore, must be electrically connected to its associated terminal.

Ordinarily, one of the regions of the wafer, the collector for example, is grounded. Because the header 12 is normally plated with a metallic material, this connection may be effected by bonding the collector region of the wafer 11 directly to the header. Then, the terminal 15 need only be joined to the header in order to be connected to the collector.

The electrical joining of the emitter and base regions to their respective terminals, however, requires ungrounded means of connection. Often, a separate metallic stripe, which may be of aluminum, is sputtered onto each of these regions. In the case of the wafer 11, a metallic stripe 16 is sputtered onto the base region and a metallic stripe 17 is sputtered onto the emitter region. These metallic stripes (approximately 2 mils x 4 mils in size) are electrically connected by means of extremely fine conductive lead 18 to their respective terminals 13 and 14. The conductive lead 18 is normally made of gold wire having a diameter of approximately 1 mil. The terminals, in turn, are inserted through the header 12 and supported by means of insulating sleeves 19.

It will be seen from the above description that two bonding operations are required in the manufacture of the transistor 10. The first bonding operation is that wherein the wafer 11 is bonded to the header 12. The second is that wherein the fine conductive lead 18 is connected from the stripes 16 and 17 to the terminals 13 and 14, respectively. In either bonding operation, heat is normally applied. For example, in the well-known thermocompression bonding technique which is utilized extensively in the manufacture of transistors, heat and pressure are simultaneously applied to form the required bonds.

Figure 3:
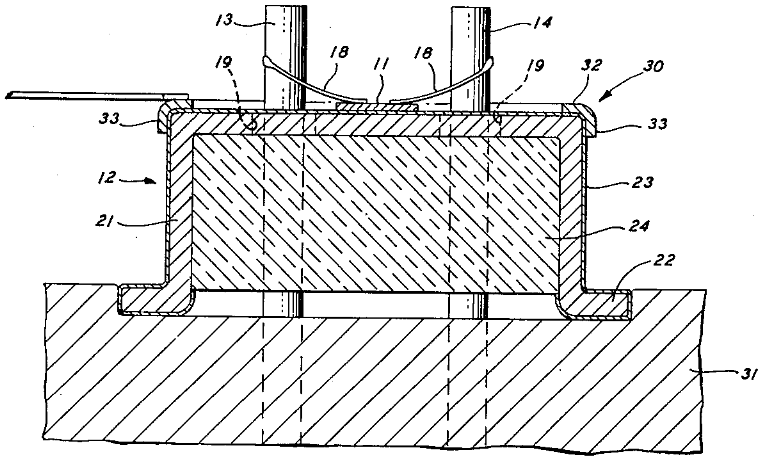
FIG. 3 is a cross-sectional view taken along line 3—3 of FIG. 2.

Before describing the operation of the apparatus of the invention, reference will first be made to FIG. 3 wherein the construction of the header 12 is illustrated. The header 12 is normally made of a metallic material known as "Kovar" for a reason that will be explained hereinafter. "Kovar" is a trademark for an alloy comprising 29% nickel, 17% cobalt, and 0.2% manganese, the remainder being iron.

In the present embodiment, the "Kovar" is pressed into a hat-shaped form having a hollow cylindrical crown portion 21 and a flange portion 22. The "Kovar," though metallic, is highly resistive electrically. For that reason, its outer surface is usually plated with a highly conductive material 23, preferably gold. The wafer 11 is bonded to the gold plate whereby a conductive path is provided from the collector region to the terminal 15 (FIG. 2).

As indicated before, provision in the form of insulating sleeves 19 is made to prevent the terminals 13 and 14 from being short-circuited to the header. These sleeves may be formed, for example, by filling the hollow interior of the "Kovar" shell with some insulating material 24, such as glass. The glass is melted in the shell so as to flow around the terminals and into the oversized apertures in the shell through which the terminals pass. Thus, the hardening of the glass provides the insulating sleeves 19 and support for the terminals as well.

"Kovar" has a unique characteristic in that its thermal coefficient of expansion very nearly matches that of glass. Therefore, the use of "Kovar" is preferred in order to minimize thermal stresses which might otherwise result from the use of glass within the metallic shell.

With this as a background, the instant embodiment of the apparatus of the present invention will be described. As shown in FIGS. 2 and 3, the apparatus utilizes a pair of metallic electrodes 30 and 31. Electrode 31 is advantageously provided in the form of a socket having openings therein for receiving the terminals 13, 14 and 15. Electrode 30, on the other hand, is advantageously made in the shape of a ring 32 having a surrounding lip 33. The inner diameter of the lip 33 should correspond approximately with the outer diameter of the crown portion 21 of the header 12. Furthermore, the inner diameter of the ring 32 should be of large enough diameter so that the electrodes 13, 14 and 15 may pass therethrough. In this way, the electrode 30 may be snugly capped over the top of the crown portion 21, as indicated in FIG. 3.

With the transistor 10 thus positioned between the two electrodes, heating is effected in the following manner. If a difference of potential is applied across the electrodes 30 and 31, a current will tend to flow between them. This current will tend to flow through the gold plate because of its relatively high conductivity. However, the gold plate is extremely thin and can sustain only small quantities of current flow such as that, for example, which flows in the collector circuit. Consequently, heavy current flow between the electrodes 30 and 31 must find a path through the "Kovar" shell.

As has been noted, "Kovar" has a very high electrical resistance. For that reason, the passage of current through the "Kovar" produces a relatively large amount of heat. The "Kovar" shell therefore acts as a heat source which brings the transistor up to a temperature dependent upon the amount of current passing between the electrodes.

This heat spreads throughout the transistor to the members which are to be bonded, that is, to the wafer 11 and the terminals 13 and 14. It will be noted that the heating is effectively confined to the transistor alone and is not applied to any of the adjacent equipment. This localization is due to the fact that the high-resistance heat source is located within the transistor itself while the electrodes, which are highly conductive, do not generate appreciable heat despite the passage of large currents therethrough. In addition, because of the small size of the heat source, the heating of the transistor is very rapid, whereas in previous systems it was often required to bring external large bodies up to temperature in order to heat the transistor.

Figure 1:
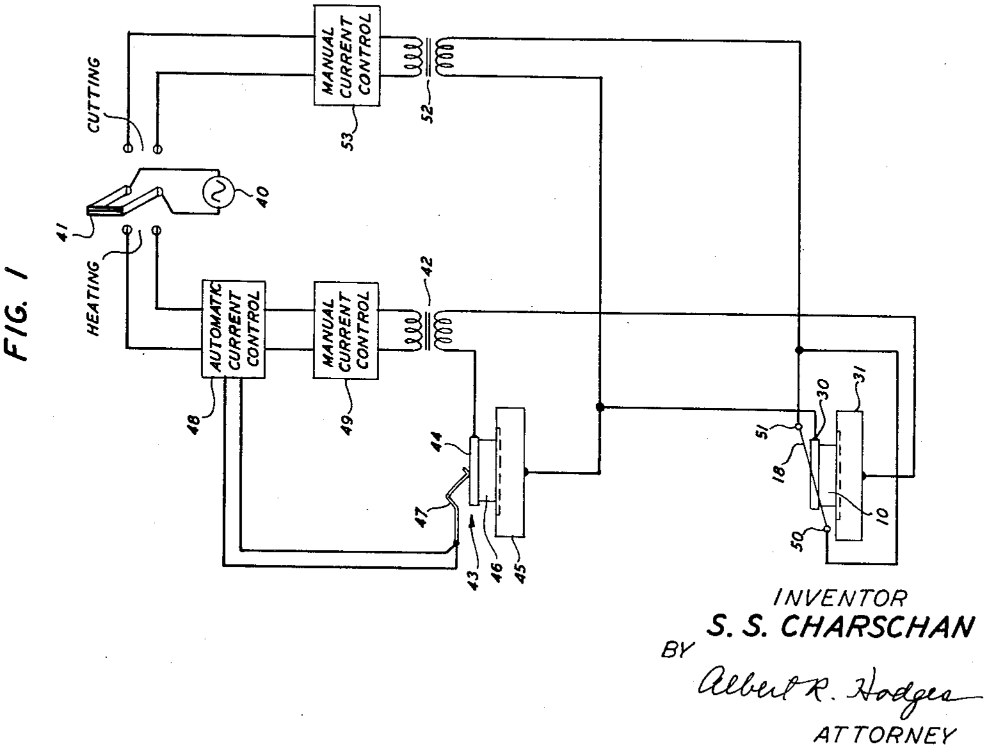
FIG. 1 is a schematic diagram of a system forming one embodiment of the invention.

Another advantage of the present invention is that the temperature of the heated transistor may be very accurately controlled. A system whereby such control may be effected is illustrated in FIG. 1. In such system, an alternating-current voltage is impressed across the electrodes 30 and 31 from a source 40 through a switching means 41. The source 40 may be a standard 115-volt, 60-cycle outlet. In that event, a transformer 42 should be connected across the source 40. The transformer 42 is adapted to convert the relatively high-voltage, low-current input to its primary winding to a relatively low-voltage, high-current output at its secondary winding. This provides for the passage of a larger current, more suitable for heating purposes, through the transistor 10.

In the system of FIG. 1, temperature control is provided by means of a duplicate heating arrangement indicated generally at 43. The arrangement 43 includes an electrode 44 which is a duplicate of the electrode 30, an electrode 45 which is a duplicate of the electrode 31, and a transistor 46 which is a duplicate of the transistor 10. The transistor 46 is arranged between the electrodes 44 and 45 just as is the transistor 10 between the electrodes 30 and 31.

The arrangement 43 is connected in series with the actual heating facility so that the same current from the transformer 42 passes through both. Accordingly, since the duplicate arrangement is identical with the actual facility, the temperature of the transistor 46 will approximate that of the transistor 10. Measurement of the temperature of the transistor 46 will therefore provide an accurate indication of the bonding temperature.

The arrangement 43 may be semi-permanent in nature. That is to say, while different transistors 10 are being bonded and replaced in the actual heating facility, the duplicate arrangement may remain unchanged so long as the transistor 46 is of the same type as the transistor being bonded. For that reason, the arrangement 43 may easily be provided with means for measuring the temperature of its transistor. On the other hand, temperature measuring means would be introduced with difficulty in the actual heating facility in view of the fact that the transistors therein are constantly being replaced and that the facility must be positioned within the bonding area which may be relatively inaccessible.

Means for measuring the temperature of the transistor 46 may take a variety of forms. Preferably, a thermocouple 47 brazed or otherwise secured to the top of the crown portion of the transistor 46 is utilized. In this way, the temperature of the transistor may be provided in terms of a voltage output. This voltage may then be utilized as an information input to an automatic current control unit 48. The unit 48 is advantageously located on the primary side of the transformer 42 since the smaller current there present is more readily controlled. For initial settings, manual current control means 49, such as a variable transformer which may include that sold under the trademark "Variac," is also advantageously provided.

With this arrangement, a feedback path is provided whereby the temperature of the transistor 46, and therefore that of the transistor 10, may be automatically and accurately controlled. Thus, at the beginning of the heating cycle when the transistors 10 and 46 are cool, the thermocouple provides a correspondingly small voltage output. In response to this thermocouple output, the current control unit 48 is adapted to permit a relatively large current flow, thereby to quickly bring the transistors up to temperature. As the transistors heat up, however, the voltage at the thermocouple terminals increases in value. The automatic control unit 48 is adapted to reduce current flow in proportion to the increase in voltage output of the thermocouple. As a result, the heating rate of the transistors is reduced. The feedback arrangement may thus be set to arrive at an equilibrium condition when the transistors have been raised to the desired bonding temperature.

Figure 4:
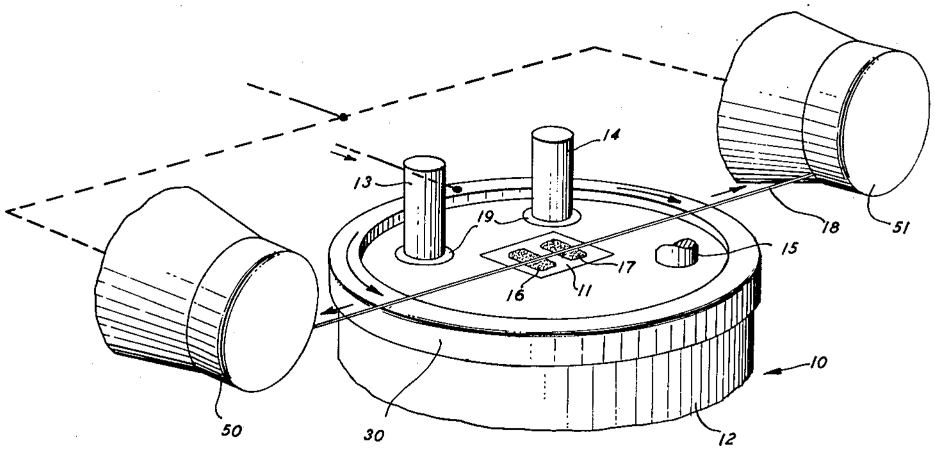
FIG. 4 is a perspective view illustrating the utilization of one of the electrode members of FIG. 2 as a means for cutting conductive lead.

Reference will now be made to FIG. 4 wherein is shown another aspect of the invention. In the above-mentioned copending patent application, apparatus is provided for securing conductive lead to semiconductive devices. A portion of this apparatus, namely a pair of clamping elements 50 and 51, is shown in FIG. 4. In this apparatus, the conductive lead 18, for example, is stretched between these clamping elements and the transistor 10 is moved upwardly so as to bring the metallic stripes 16 and 17 on the wafer 11 into contact with the taut conductive lead. Means are provided for then bonding the conductive lead to the stripes and for severing the lead free from the clamping elements 50 and 51 after the bonding to the stripes is completed. Thereafter, the freed ends of the lead 18 are bonded to the terminals 13 and 14, respectively.

The present invention has particular utility in the aforementioned apparatus, in that it provides superior means for severing the conductive lead loose from the clamping elements. Referring again to FIG. 1, it will be noted that the power source 40 is adapted to be applied to the primary winding of another transformer 52 by means of the switch 41. One end of the secondary winding of the transformer 52 is connected to the annular electrode 30. The other end of the transformer 52 is connected in common to the metallic clamping elements 50 and 51. Therefore, when power is applied to the transformer 52, current flows in its secondary circuit through the annular electrode 30 and through those portions of the lead 18 which lie between the outer periphery of the electrode 30 and the clamping elements 50 and 51 (see FIG. 4).

This current is provided, by means of the transformer 52, at a value greater than the current-carrying capacity of the lead 18 by an amount which may be adjusted by a manual current control means 53. As a result, burning-out can be made to occur in the current-carrying portions of the lead 18 to effect the desired severance from the clamping elements. Insurance that the length of the lead remaining attached to the stripes 16 and 17 will be sufficient for effecting the desired connection between the stripes and the terminals 13 and 14 may therefore be provided by appropriate selection of the outer diameter of the electrode 30.

Accordingly, the apparatus of FIG. 1 may be utilized to perform its double function in the following manner. In order to heat the transistor 10, the switch 41 is connected to provide power to the transformer 42 whereby current passes through the electrodes 30 and 31. The transistor 10 is thus automatically brought up to bonding temperature by means of the control unit 48. The bonding operation is then begun. At that point in the bonding process when severing of the lead 18 from the clamping elements 50 and 51 is required, the switch 41 is momentarily transferred to connect the power source 40 to the transformer 52. Thereupon, current passes through the electrode 30, the outer portions of the conductive lead 18 and the clamping elements 50 and 51 to cause the lead to be severed at two places. The switch 41 is then returned to its original heating position and the bonding operation is continued.

Figure 5:
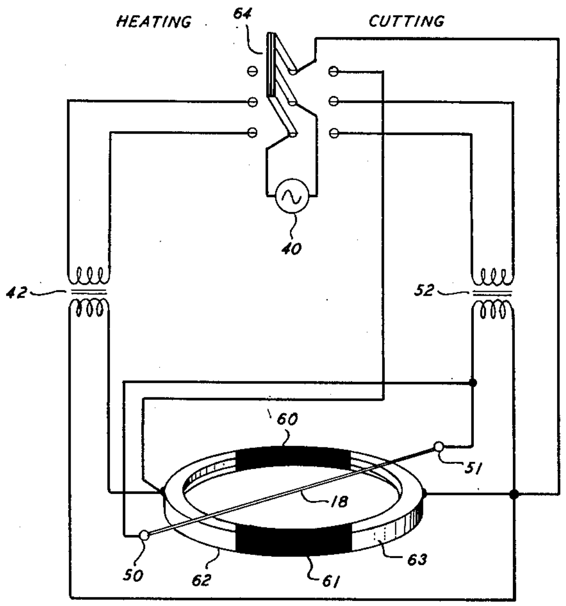
FIG. 5 is a schematic diagram, including structure, of a system forming an alternative embodiment of the invention.
Figure 6:
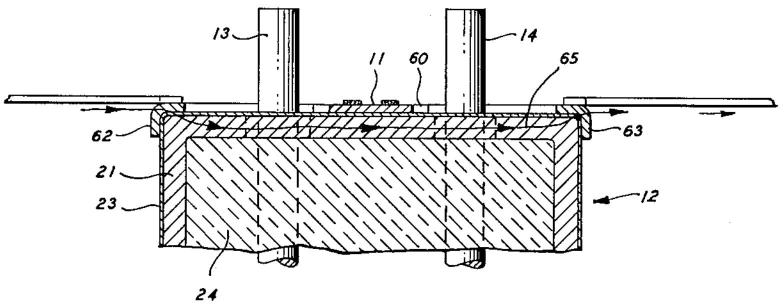
FIG. 6 is a cross-sectional view illustrating the operation of the embodiment of FIG. 5.

Another embodiment of the present invention is illustrated in FIG. 5. In this embodiment, the electrode 30 is modified by the provision of two separate insulating sections 60 and 61 interposed in the annular electrode so as to divide it into two crescent-shaped conductive portions 62 and 63. For effecting heating, the portions 62 and 63 are connected to opposite sides of the secondary of the transformer 42, respectively. The only course which the current can take between these portions, therefore, is through the top of the crown portion of the header 12, as shown by the arrow 65 in FIG. 6. This provides more localized heating than does the embodiment of FIG. 2, in that the current is restricted to that volume of the "Kovar" which is in the immediate vicinity of the wafer and the terminals.

This alternative embodiment may also be employed for the previously described lead-cutting function. To that end, the lead 18 is so positioned as to contact both of the electrode portions 62 and 63. The cutting current is then confined to the desired outer portions of the lead by connecting the two electrode portions 62 and 63 in common to one side of the secondary winding of the transformer 52 while connecting the clamping elements 50 and 51, as before, in common to the other side of the secondary winding. It will be noted that a triple-pole switch 64 is utilized in this system in order to connect the two portions 62 and 63 together only during the cutting cycle.

It is to be understood that the above-described arrangements are simply illustrative of the application of the principles of the invention. Numerous other arrangements may be devised by those skilled in the art which will embody the principles of the invention and fall within the spirit and scope thereof.

What is claimed is:

1. Heating and conductive-lead-cutting means for a semiconductor device having a metallic header portion, comprising an electrode adapted to be fitted on said header, means including said electrode for selectively passing heating current through said header, means for positioning conductive lead across said electrode with at least one outer portion of said lead extending beyond an extremity of said electrode, and means including said electrode for selectively passing cutting current having a value greater than the current-carrying capacity of said lead through only said outer portion of said lead.

2. Heating and conductive-lead-cutting means for a semiconductor device having a metallic header portion, comprising first and second electrodes adapted to be fitted on said header at separated position, means for selectively appling a difference of potential across said electrodes to cause heating current to pass through said header, means for positioning conductive lead across said first electrode with at least one outer portion of said lead extending beyond an extremity of said electrode, and means including said first electrode for selectively passing cutting current having a value greater than the current-carrying capacity of said lead through only said outer portion of said lead.

3. Heating and conductive-lead-cutting means for a semiconductor device having a metallic header portion, comprising a first annular electrode and a second electrode adapted to be fitted on said header at separated positions, means for selectively applying a difference of potential across said electrodes to cause heating current to pass through said header, means for positioning conductive lead across said annular electrode with the outer portions of said lead extending beyond the periphery of said electrode, and means for selectively applying a predetermined difference of potential between said annular electrode and a selected location on each of said outer portions of said lead to cause cutting current having a value greater than the current-carrying capacity of said lead to pass only through said outer portions.

4. Heating and conductive-lead-cutting means in accordance with claim 3, which includes a duplicate heating facility electrically connected in series with said first and second electrodes, and means responsive to the temperature of said duplicate heating facility for controlling the temperature of said header.

5. Heating and conductive-lead-cutting means in accordance with claim 3, which includes metallic holding elements for supporting said conductive lead at said selected locations.

6. Heating and conductive-lead-cutting means for a semiconductor device including a metallic header portion, comprising an electrode having two electrically independent conductive sections adapted to be fitted on said header at separated positions, means for selectively applying a difference of potential across said sections to cause a heating current to pass through said header, means for selectively short-circuiting said electrode sections together, means for positioning conductive lead across said electrode in contact with both said conductive sections with each outer portion of said lead extending beyond an extremity of its respective section, and means for selectively applying a predetermined difference of potential between said electrode and a selected location on each of said outer portions of said lead to cause cutting current having a value greater than the current-carrying capacity of said lead to pass only through said outer portions.

7. Heating and conductive-lead-cutting means in accordance with claim 6, which includes a duplicate heating facility electrically connected in series with said electrode sections, and means responsive to the temperature of said duplicate heating facility for controlling the temperature of said header.

8. Heating and conductive-lead-cutting means in accordance with claim 6, which includes metallic holding elements for supporting said conductive lead at said selected locations.

9. Heating and conductive-lead-cutting means for a semiconductor device including a metallic header portion, comprising an annular electrode having two electrically conductive sections which are insulated one from the other and arranged to be fitted on said header in separated positions, means for selectively applying a difference of potential across said sections to cause a heating current to pass through said header, means for selectively short-circuiting said electrode sections together, means for positioning conductive lead across said electrode in contact with both said conductive sections with each outer portion of said lead extending beyond an extremity of its respective section, and means for selectively applying a predetermined difference of potential between said electrode and a selected location on each of said outer portions of said lead to cause cutting current having a value greater than the current-carrying capacity of said lead to pass only through said outer portions.

10. Heating and temperature controlling means for a semiconductor device having a metallic header portion, comprising a heating electrode adapted to be fitted on said header, circuit means including said heating electrode for passing heating current through said header, a duplicate heating facility including a semiconductor device similar to that being heated and an electrode similar to said heating electrode, said duplicate facility being connected in series arrangement in said circuit means, and means responsive to the temperature of the duplicate heating facility for controlling the temperature of the semiconductor device in said duplicate facility to thereby control the temperature of the semiconductor device being heated.

11. Heating and temperature controlling means for a semiconductor device having a metallic header portion, comprising a heating electrode adapted to be fitted on said header, circuit means including said heating electrode for passing heating current through said header, a duplicate heating facility including a semiconductor device similar to that being heated and an electrode similar to said heating electrode, said duplicate facility being connected in series arrangement in said circuit means, sensing means responsive to the temperature of the duplicate heating facility for producing a signal indicative of the temperature of the semiconductor device in said duplicate facility, and current control means responsive to said signal for varying said heating current to maintain the temperature of the semiconductor device at a predetermined value.

12. An apparatus for cutting a conductive lead comprising a conductive member having an aperture therethrough, means for positioning the lead over the aperture and in contact with said member, and means connected to said member and said positioning means for passing current through said lead to simultaneously cut the lead at two separate and spaced points.

13. An apparatus for heating a disk-like member having a high resistance and for cutting a conductive lead, comprising a first electrode of low resistance having a recess therein into which the disk-like member is inserted, a second electrode of low resistance having a cap-like configuration fitted over the top of the disk-like member to fixedly hold said member in said recess and having an aperture therethrough, means connected to said electrodes for passing current through said disk-like member to heat said member, means for positioning the lead over the aperture and in contact with the first electrode, and means connected to said first electrode and said positioning means for passing current through said lead to simultaneously cut the lead at two separate and spaced points.

References Cited in the file of this patent

UNITED STATES PATENTS

| | | |
|---|---|---|
| 2,621,277 | Brewer | Dec. 9, 1952 |
| 2,667,557 | Herzog | Jan. 26, 1954 |